United States Patent
Watanabe et al.

(10) Patent No.: US 12,247,124 B2
(45) Date of Patent: *Mar. 11, 2025

(54) RESIN SHEET

(71) Applicant: LINTEC CORPORATION, Tokyo (JP)

(72) Inventors: Yasutaka Watanabe, Tokyo (JP); Yasunori Karasawa, Tokyo (JP); Kazue Uemura, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 157 days.

This patent is subject to a terminal disclaimer.

(21) Appl. No.: 17/792,615

(22) PCT Filed: Jan. 15, 2021

(86) PCT No.: PCT/JP2021/001207
§ 371 (c)(1),
(2) Date: Jul. 13, 2022

(87) PCT Pub. No.: WO2021/145416
PCT Pub. Date: Jul. 22, 2021

(65) Prior Publication Data
US 2023/0090587 A1    Mar. 23, 2023

(30) Foreign Application Priority Data

Jan. 16, 2020 (JP) .................................. 2020-005184
Jul. 27, 2020 (JP) .................................. 2020-126347

(51) Int. Cl.
*C08L 79/08* (2006.01)
*C08G 8/10* (2006.01)
(Continued)

(52) U.S. Cl.
CPC ............... *C08L 79/08* (2013.01); *C08G 8/10* (2013.01); *C08G 73/127* (2013.01); *C08J 5/18* (2013.01);
(Continued)

(58) Field of Classification Search
CPC ........ C08G 73/12–73/127; H05K 1/00–1/189; C09D 179/08; C08L 79/00–79/085
See application file for complete search history.

(56) References Cited

U.S. PATENT DOCUMENTS

2018/0009195 A1* 1/2018 Takeuchi ................ B32B 27/34

FOREIGN PATENT DOCUMENTS

| CN | 101518171 A | 8/2009 |
|---|---|---|
| CN | 111808421 A | 10/2020 |

(Continued)

OTHER PUBLICATIONS

Machine translation of KR1020180022423. Retrieved Mar. 15, 2024.*
(Continued)

*Primary Examiner* — Prashant J Khatri
(74) *Attorney, Agent, or Firm* — Rimon P.C.

(57) ABSTRACT

A resin sheet is made using a resin composition containing a thermosetting component (A) and a thermally conductive filler (C). The thermosetting component (A) contains a maleimide resin. A thermal diffusion rate of the thermally cured resin sheet is $1.0 \times 10^{-6}$ m$^2$/s or more. When a cross section (P) of the resin sheet taken by cutting the resin sheet in a vertical direction to a surface of the resin sheet is observed in an area (P1), a condition represented by a numerical formula (F1) below is satisfied, the area (P1) being defined by a square whose sides are four times as large as a thickness of the resin sheet and including two surfaces of the resin sheet, $$0.25 \leq Ld/Lt \leq 1 \quad (F1)$$

(Continued)

where Ld is a vertical length of a filler particle having a largest cross-sectional diameter in the vertical direction of the thermally conductive filler (C), and Lt is a length of the resin sheet.

11 Claims, 3 Drawing Sheets

(51) Int. Cl.
| | |
|---|---|
| C08G 73/12 | (2006.01) |
| C08J 5/18 | (2006.01) |
| C08K 3/22 | (2006.01) |
| C08K 3/38 | (2006.01) |
| C08K 5/3492 | (2006.01) |
| C09D 179/08 | (2006.01) |
| H01L 23/29 | (2006.01) |
| H01L 23/31 | (2006.01) |
| H05K 1/03 | (2006.01) |

(52) U.S. Cl.
CPC ............... *C08K 3/22* (2013.01); *C08K 3/38* (2013.01); *C08K 5/3492* (2013.01); *C09D 179/08* (2013.01); *H01L 23/295* (2013.01); *H01L 23/31* (2013.01); *H05K 1/03* (2013.01); *C08J 2379/08* (2013.01); *C08K 2003/2227* (2013.01); *C08K 2003/385* (2013.01)

(56) References Cited

FOREIGN PATENT DOCUMENTS

| | | | |
|---|---|---|---|
| JP | 2007-224060 A | | 9/2007 |
| JP | 2008-120065 A | | 5/2008 |
| JP | 2013-258296 A | | 12/2013 |
| JP | 2015-019051 A | | 1/2015 |
| JP | 2015086343 A | * | 5/2015 |
| JP | 2016-088992 A | | 5/2016 |
| JP | 2017-160440 A | | 9/2017 |
| JP | 2018-024747 A | | 2/2018 |
| JP | 2019-108496 A | | 7/2019 |
| JP | 2019-182932 A | | 10/2019 |
| JP | 2020-173945 A | | 10/2020 |
| KR | 1020180022423 A | * | 3/2018 |
| TW | 201819534 A | | 6/2018 |
| TW | 201842000 A | | 12/2018 |
| WO | 2008/038734 A1 | | 4/2008 |
| WO | 2018/160348 A1 | | 9/2018 |
| WO | 2019/111978 A1 | | 6/2019 |

OTHER PUBLICATIONS

Machine translation of JP2019-182932. Retrieved Mar. 14, 2024.*
Machine translation of JP2015-086343. Retrieved Mar. 14, 2024.*
"BMI-3000 Tech Data Sheet". Designer Molecules Inc, (Mar. 2016).*
English translation of the International Preliminary Report on Patentability issued in corresponding International Patent Application No. PCT/JP2021/001207, dated Jul. 19, 2022.
International Search Report issued in corresponding International Patent Application No. PCT/JP2021/001207, dated Mar. 1, 30, 2021, with English translation.
First Office Action received in Chinese Patent Application No. 202180009389.4, dated Dec. 26, 2023.
Office Action dated Jul. 2, 2024, from corresponding Taiwanese patent application No. 110101614, 23 pages.

* cited by examiner

RESIN SHEET

CROSS-REFERENCE TO RELATED APPLICATIONS

This application is the U.S. National Phase under 35 U.S.C. § 371 of International Patent Application No. PCT/JP2021/001207, filed on Jan. 15, 2021, which in turn claims the benefit of Japanese Patent Application No. 2020-005184, filed on Jan. 16, 2020, and Japanese Patent Application No. 2020-126347, filed on Jul. 27, 2020, the entire content of each of which is incorporated herein by reference.

TECHNICAL FIELD

The present invention relates to a resin sheet.

BACKGROUND ART

Studies have been made to provide a resin sheet for power semiconductors that contains a high thermal conductive material such as alumina. Patent Literature 1 discloses that a resin sheet, which is in a form of a sheet-shaped product of an epoxy resin composition containing an alumina filler, is applied in power semiconductor equipment.

CITATION LIST

Patent Literature(s)

Patent Literature 1 JP 2017-160440 A

SUMMARY OF THE INVENTION

Problem(s) to be Solved by the Invention

However, heat resistance of the resin composition disclosed in Patent Literature 1 is considered to be insufficient for a power semiconductor device that is expected to operate at a high temperature of 200 degrees C. or more. Further, the resin sheet disclosed in Patent Literature 1 needs further improvement in thermal conductivity as well as strong adhesiveness to an adherend.

An object of the invention is to provide a resin sheet with improved heat resistance, thermal conductivity, and adhesiveness after being thermally cured.

Means for Solving the Problem(s)

A resin sheet according to an aspect of the invention is made using a resin composition that contains a thermosetting component (A) and a thermally conductive filler (C). The thermosetting component (A) contains a maleimide resin. A thermal diffusion rate of the resin sheet after being thermally cured is $1.0 \times 10^{-6}$ m²/s or more. When a cross section (P) of the resin sheet taken by cutting the resin sheet in a vertical direction to a surface of the resin sheet is observed in an area (P1), a condition represented by a numerical formula (F1) below is satisfied, the area (P1) being defined by a square whose sides are four times as large as a thickness of the resin sheet, the area (P1) including two surfaces of the resin sheet, $$0.25 \leq Ld/Lt \leq 1 \quad (F1)$$

where Ld is a vertical length of a filler particle having a largest cross-sectional diameter in the vertical direction of the thermally conductive filler (C), and Lt is a length of the resin sheet in the vertical direction.

In the resin sheet according to the above aspect of the invention, it is preferable that the thermosetting component (A) contains a first maleimide resin (A1), and the first maleimide resin (A1) is a maleimide resin that is solid at a temperature of 25 degrees C. and has two or more maleimide groups in one molecule, at least a pair of the maleimide groups being bonded by a bonding group whose main chain has four or more methylene groups.

In the resin sheet according to the above aspect of the invention, it is preferable that the thermosetting component (A) further contains a compound having a triazine skeleton (A4).

In the resin sheet according to the above aspect of the invention, it is preferable that the compound having the triazine skeleton (A4) is an imidazole compound having a triazine skeleton.

In the resin sheet according to the above aspect of the invention, it is preferable that the thermosetting component (A) further contains an allyl resin (A5).

In the resin sheet according to the above aspect of the invention, it is preferable that the resin composition further contains boron nitride particles (C1).

In the resin sheet according to the above aspect of the invention, it is preferable that the resin composition further contains alumina particles (C2).

In the resin sheet according to the above aspect of the invention, it is preferable that a sum of contents of the boron nitride particles (C1) and the alumina particles (C2) is 78.5 mass % or more with respect to a total solid content of the resin composition.

In the resin sheet according to the above aspect of the invention, it is preferable that the resin sheet is used for sealing a semiconductor device, or used by being interposed between the semiconductor device and any other electronic component.

In the resin sheet according to the above aspect of the invention, it is preferable that the resin sheet is used by being interposed between a heat sink and an electronic component.

In the resin sheet according to the above aspect of the invention, it is preferable that the resin sheet is used for sealing a semiconductor device made using a compound semiconductor, or used by being interposed between the semiconductor device made using the compound semiconductor and any other electronic component.

In the resin sheet according to the above aspect of the invention, it is preferable that the resin sheet is a coating film of the resin composition.

According to the above aspects of the invention, a resin sheet with improved heat resistance, thermal conductivity, and adhesiveness after being thermally cured and a method for manufacturing the resin sheet can be provided.

DESCRIPTION OF EMBODIMENT(S)

Resin Composition

Initially, a resin composition for providing a resin sheet according to an exemplary embodiment will be described below.

The resin composition according to the exemplary embodiment contains a thermosetting component (A). The thermosetting component (A) according to the exemplary embodiment contains a maleimide resin. The thermosetting component (A) according to the exemplary embodiment preferably contains a first maleimide resin (A1).

Thermosetting Component (A)

The thermosetting component (A) (hereinafter simply referred to as "component (A)" in some cases) has a property of forming a three-dimensional network upon being heated to be firmly bonded to an adherend. As described above, the thermosetting component (A) of the exemplary embodiment preferably contains the first maleimide resin (A1) (hereinafter simply referred to as "component (A1)" in some cases).

Maleimide Resin

The maleimide resin of the exemplary embodiment is not particularly limited as long as the maleimide resin includes two or more maleimide groups in one molecule. The resin composition of the exemplary embodiment, which contains the maleimide resin, improves heat resistance of the resin sheet of the exemplary embodiment after the resin sheet is thermally cured.

Examples of the maleimide resin of the exemplary embodiment include a first maleimide resin (A1), a second maleimide resin (A2), and a third maleimide resin (A3).

First Maleimide Resin (A1)

The first maleimide resin (A1) of the exemplary embodiment is a maleimide resin having two or more maleimide groups in one molecule, at least a pair of the maleimide groups being bonded by a bonding group whose main chain has four or more methylene groups.

In view of flexibility of the cured product, the bonding group bonding the two maleimide groups herein preferably has six or more methylene groups in the main chain, more preferably eight or more methylene groups in the main chain, and especially preferably ten or more methylene groups in the main chain. These methylene groups are further preferably mutually bonded to form an alkylene group having four or more carbon atoms. In this alkylene group, at least one of —$CH_2$— is optionally replaced with —$CH_2$—O— or —O—$CH_2$—.

Further, the bonding group bonding the two maleimide groups preferably has at least one side chain in view of flexibility of the cured product. Examples of the side chain include an alkyl group and an alkoxy group. When the bonding group has two or more side chains, the side chains are optionally mutually bonded to form an alicyclic structure.

It is necessary for the first maleimide resin (A1) of the exemplary embodiment to be solid at a temperature of 25 degrees C. Presumably, the first maleimide resin (A1) (i.e. the component (A1)) that is solid at a temperature of 25 degrees C. serves not only as the thermosetting component but also as a binder component. Since component (A1) is easily softened, replacing the binder component with the component (A1) improves followability of the resin sheet before being cured to a concave-convex surface of an adherend. The increase in the amount of thermally conductive filler is thus achievable while keeping adhesiveness. Accordingly, the use of the component (A1) improves both thermal conductivity and adhesiveness of the resin sheet.

Further, the component (A1) is excellent in compatibility with additional maleimide resin(s) when such additional maleimide resin is used.

The first maleimide resin (A1) of the exemplary embodiment is preferably represented by a formula (A1) below in view of the flexibility and heat resistance of the cured product.

[Formula 1]

(A1)

In the formula (A1), $n_{11}$ is an integer of 0 or more, preferably an integer in a range from 1 to 10, and more preferably an integer in a range from 1 to 5. Further, the average of $n_{11}$ is preferably in a range from 0.5 to 5, and more preferably in a range from 1 to 2.

$L^{11}$ and $L^{12}$ are each independently a substituted or unsubstituted alkylene group having 4 or more carbon atoms. In this alkylene group, at least one of —$CH_2$— is optionally replaced with —$CH_2$—O— or —O—$CH_2$—. In view of the flexibility of the cured product, the alkylene group preferably has 6 or more carbon atoms, more preferably 8 or more carbon atoms, and especially preferably 10 or more and 30 or less carbon atoms. When a hydrogen atom of the alkylene group is replaced with a substituent, the substituent is an alkyl group having 1 to 14 carbon atoms, or an alkoxy group having 1 to 14 carbon atoms. Further, the substituents are optionally bonded with each other to form an alicyclic or heterocyclic structure.

$X_{11}$ is each independently a group not having a substituted or unsubstituted alkylene group having 4 or more carbon atoms (including those whose at least one of —$CH_2$— is replaced with —$CH_2$—O— or —O—$CH_2$—). $X_{11}$ is preferably a divalent group having a phthalimide group. It should be noted that the phthalimide group includes groups derived from phthalimide. A specific example of $X^{11}$ is a group represented by a structural formula (A1-1) below.

[Formula 2]

(A1-1)

Specific examples of the maleimide resin represented by the formula (A1) according to the exemplary embodiment include a compound represented by a formula (A1-1-1) below. This compound is solid at a temperature of 25 degrees C.

[Formula 3]

(A1-1-1)

In the formula (A1-1-1), $n_{11}$ is an integer in a range from 1 to 5.

Examples of commercially available products of the maleimide resin represented by the formula (A1-1-1) include "SLK-3000" manufactured by Shin-Etsu Chemical Co., Ltd.

In the exemplary embodiment, the content of the component (A1) in the maleimide resin is preferably 10 mass % or more, more preferably 17.5 mass % or more, and especially preferably 42.5 mass % or more with respect to a total solid content of the maleimide resin (i.e. when the content of a non-volatile component of the maleimide resin except for a solvent is defined as 100 mass %). When the content of the component (A1) in the maleimide resin is within the above range, the amount of the thermally conductive filler in the resin sheet can be further increased. The content of the component (A1) in the maleimide resin is preferably 100 mass % or less, more preferably 75 mass % or less, and further preferably 60 mass % or less with respect to a total solid content of the maleimide resin.

For the same point of view, the content of the component (A1) in the maleimide resin is preferably 2.5 mass % or more, more preferably 4 mass % or more, and further preferably 6 mass % or more with respect to a total solid content of the resin composition (i.e. when the total content of a non-volatile component of the resin composition except for a solvent is defined as 100 mass %). The content of the component (A1) in the maleimide resin is preferably 15 mass % or less and more preferably 12 mass % or less with respect to a total solid content of the resin composition.

Second Maleimide Resin (A2)

In order to increase a storage modulus E' at 250 degrees C. of the cured product of the resin sheet, the thermosetting component (A) contained in the resin composition of the exemplary embodiment optionally contains a second maleimide resin (A2) whose chemical structure is different from that of the above-described first maleimide resin (A1). The second maleimide resin (A2) of the exemplary embodiment (hereinafter simply referred to as "component (A2)" in some cases) is not particularly limited as long as the chemical structure of the second maleimide resin is different from that of the first maleimide resin (A1) and contains two or more maleimide groups in one molecule. Specifically, the second maleimide resin (A2) is a maleimide resin having two or more maleimide groups in one molecule, any two of the maleimide groups being bonded by a bonding group of which main chain does not have four or more methylene groups. The component (A2) contained in the resin sheet improves cohesive properties of the cured resin sheet, thus inhibiting the decrease in adhesiveness which may otherwise be caused by cohesive failure of the cured resin sheet.

In view of heat resistance, the second maleimide resin (A2) of the exemplary embodiment preferably includes, for instance, a benzene ring, and more preferably includes a structure including a benzene ring bonded with a maleimide group. Further, a maleimide compound preferably includes two or more structures each including a benzene ring bonded with a maleimide group.

The second maleimide resin (A2) of the exemplary embodiment is preferably a maleimide resin including two or more maleimide groups and at least one biphenyl skeleton (hereinafter simply referred to as "biphenyl maleimide resin" in some cases) in one molecule.

The second maleimide resin (A2) of the exemplary embodiment is preferably represented by a formula (1) below in view of the heat resistance and adhesiveness.

[Formula 4]

(1)

In the formula (1), k is an integer of 1 or more. The average of k is preferably in a range from 1 to 10, more preferably in a range from 1 to 5, and further preferably in a range from 1 to 3. m1 and m2 are each independently an integer of 1 or more and 2 or less, and more preferably 1. It should however be noted that the sum of m1 and m2 is 3 or less. n1 and n2 are each independently an integer of 0 or more and 4 or less, preferably an integer of 0 or more and 2 or less, and more preferably 0. $R^1$ and $R^2$ are each independently an alkyl group having 1 to 6 carbon atoms, preferably an alkyl group having 1 to 3 carbon atoms, and more preferably a methyl group. A plurality of $R^1$ are mutually the same or different. A plurality of $R^2$ are mutually the same or different.

Specific examples of the maleimide resin represented by the formula (1) according to the exemplary embodiment include, for instance, a compound represented by a formula (2) or a formula (3) below.

[Formula 5]

(2)

Formula [6]

(3)

In the formulae (2) and (3), k represents the same as k in the formula (1). In the formula (2), n1, n2, $R^1$ and $R^2$ represent the same as n1, n2, $R^1$ and $R^2$ in the formula (1), respectively.

ide resin having an ether bond between at least one of the maleimide groups and at least one of the phenylene groups.

The maleimide resin having two or more maleimide groups and two or more phenylene groups in one molecule is represented by, for instance, a formula (4) below.

[Formula 7]

(4)

In the formula (4), $R^3$ to $R^6$ are each independently a hydrogen atom or an alkyl group having 1 to 6 carbon atoms, L is an alkylene group having 1 to 3 carbon atoms, $L^2$ and $L^3$ are each independently an alkylene group having 1 to 2 carbon atoms, or an arylene group having 6 to 10 carbon atoms, and p and q are each independently 0 or 1. It should however be noted that a sum of the carbon atoms of $L^1$, $L^2$ and $L^3$ in a form of an alkylene group(s) is 3 or less.

The maleimide resin represented by the formula (4) according to the exemplary embodiment is specifically represented, for instance, by a formula (5) or a formula (6) below.

[Formula 8]

(5)

[Formula 9]

(6)

Examples of commercially available products of the maleimide resin represented by the formula (3) include "MIR-3000-70" manufactured by Nippon Kayaku Co., Ltd.

The second maleimide resin (A2) of the exemplary embodiment is also preferably a maleimide resin including two or more maleimide groups and two or more phenylene groups in one molecule. In order to enhance solubility to a solvent and improve sheet-formability, it is preferable that the phenylene groups are each substituted by a substituent. Examples of the substituent include alkyl groups such as a methyl group and ethyl group, and alkylene groups.

In view of sheet-formability, the second maleimide resin (A2) of the exemplary embodiment is preferably a maleim- In the formulae (5) and (6), $L^1$ is an alkylene group having 1 to 3 carbon atoms.

In the formula (5), $R^3$ to $R^6$ are each independently a hydrogen atom or an alkyl group having 1 to 6 carbon atoms.

Third Maleimide Resin (A3)

For the purpose of easily maintaining the sheet strength of the resin sheet after being thermally cured, the thermosetting component (A) contained in the resin composition of the exemplary embodiment optionally contains a third maleimide resin (A3) whose properties are different from those of the above-described first maleimide resin (A1). The third maleimide resin (A3) of the exemplary embodiment (hereinafter simply referred to as "component (A3)" in some cases) is a resin that is same in chemical structure as the first maleimide resin (A1), is different in properties from the first maleimide resin (A1), and is liquid at a temperature of 25 degrees C. The component (A3) contained in the resin sheet provides flexibility to the cured resin sheet, thereby restraining embrittlement and improving the strength of the resin sheet (e.g. impact resistance).

Specifically, the third maleimide resin (A3) of the exemplary embodiment is a spacer-group-containing maleimide resin that has two or more maleimide groups in one molecule, at least a pair of the maleimide groups being bonded by a bonding group whose main chain has four or more methylene groups, the third maleimide resin (A3) being liquid at a temperature of 25 degrees C. The use of the spacer-group-containing maleimide resin as the third maleimide resin (A3) easily maintains the sheet strength of the resin sheet after being thermally cured.

In view of the flexibility of the resin sheet, the bonding group bonding the two maleimide groups herein preferably has six or more methylene groups in the main chain, more preferably eight or more methylene groups in the main chain, and especially preferably ten or more methylene groups in the main chain. These methylene groups are further preferably mutually bonded to form an alkylene group having four or more carbon atoms. In this alkylene group, at least one of —$CH_2$— is optionally replaced with —$CH_2$—O— or —O—$CH_2$—.

Further, the bonding group bonding the two maleimide groups preferably has at least one side chain in view of flexibility of the resin sheet. Examples of the side chain include an alkyl group and an alkoxy group. When the bonding group has two or more side chains, the side chains are optionally mutually bonded to form an alicyclic structure or a heterocyclic structure.

The spacer-group-containing maleimide resin of the exemplary embodiment is preferably represented by a formula (7) below in view of the flexibility and heat resistance of the resin sheet.

[Formula 10]

(7)

In the formula (7), n is an integer of 0 or more, preferably an integer in a range from 1 to 10, and more preferably an integer in a range from 1 to 5. Further, the average of n is preferably in a range from 0.5 to 5, and more preferably in a range from 1 to 2.

$L^4$ and $L^5$ are each independently a substituted or unsubstituted alkylene group having 4 or more carbon atoms. In this alkylene group, at least one of —$CH_2$— is optionally replaced with —$CH_2$—O— or —O—$CH_2$—. In view of the flexibility of the resin sheet, the alkylene group preferably has 6 or more carbon atoms, more preferably 8 or more carbon atoms, and especially preferably 10 or more and 30 or less carbon atoms. When a hydrogen atom of the alkylene group is replaced with a substituent, the substituent is an alkyl group having 1 to 10 carbon atoms or an alkoxy group having 1 to 10 carbon atoms. Further, the substituents are optionally bonded to form an alicyclic structure.

X is each independently a group not having a substituted or unsubstituted alkylene group having 4 or more carbon atoms (including those whose at least one of —$CH_2$— is replaced with —$CH_2$—O— or —O—$CH_2$—). X is preferably a divalent group having a phthalimide group. It should be noted that the phthalimide group includes groups derived from phthalimide. Specific examples of X include a group represented by a structural formula (7-1) or a formula (7-2) below.

[Formula 11]

(7-1)

(7-2)

In the formula (7-2), $Y^1$ and $Y^2$ are each independently a hydrogen atom, a methyl group, or an ethyl group, preferably a methyl group.

Specific examples of the maleimide resin represented by the formula (7) according to the exemplary embodiment include a compound represented by a formula (7-1-1) or (7-2-1) below.

[Formula 12]

In the formulae (7-1-1) and (7-2-1), n is an integer in a range from 1 to 5. Further, the average of n is 1 or more and 2 or less.

Examples of commercially available products of the maleimide resin represented by the formula (7-1-1) include "BMI-1500" manufactured by Designer Molecules Inc., and "SLK-1500" manufactured by Shin-Etsu Chemical Co., Ltd.

Examples of commercially available products of the maleimide resin represented by the formula (7-2-1) include "BMI-1700" manufactured by Designer Molecules Inc.

When the components (A2) and (A3) are used in the exemplary embodiment, the mass ratio of the contents of the components (A2) and (A3) in the maleimide resin is preferably in a range from 25:75 to 75:25, more preferably in a range from 30:70 to 70:30, and especially preferably in a range from 40:60 to 60:40 to achieve the cohesive properties and flexibility of the cured resin sheet. When the content ratio of the components (A2) and (A3) in the maleimide resin is within the above range, the flexibility of the resin sheet of the exemplary embodiment can be further improved.

In the exemplary embodiment, the content of the maleimide resin(s) (a sum of the contents of the components (A1) to (A3)) in the component (A) is preferably 60 mass % or more, more preferably 65 mass % or more, and especially preferably 70 mass % or more with respect to a total solid content of the component (A) (i.e. when the content of a non-volatile component of the component (A) except for a solvent is defined as 100 mass %). The content of the maleimide resin(s) in the component (A) is preferably 97 mass % or less, more preferably 95 mass % or less, and further preferably 92.5 mass % or less with respect to a total solid content of the component (A). When the content of the maleimide resin(s) in the component (A) is within the above range, the heat resistance of the cured resin sheet of the exemplary embodiment can be further improved.

Compound Having Triazine Skeleton (A4)

In order to increase the peel strength of the resin sheet after being thermally cured, the resin composition of the exemplary embodiment preferably contains a compound having a triazine skeleton (A4). The compound having the triazine skeleton (A4) of the exemplary embodiment (hereinafter simply referred to as "component (A4)" in some cases) is not particularly limited as long as the compound has a triazine skeleton. In order to promote polymerization reaction of the maleimide resin and achieve the decrease in temperature for progressing the thermally curing reaction of the resin sheet and the peel strength of the cured resin sheet, the component (A4) is preferably a compound as described below. Specifically, the component (A4) is preferably a compound having a basic group and a triazine skeleton, more preferably a compound having a nitrogen-containing heterocycle and a triazine skeleton, and further preferably an imidazole compound having a triazine skeleton.

The imidazole compound having a triazine skeleton according to the exemplary embodiment is not particularly limited as long as the imidazole compound has a triazine skeleton and an imidazole group and promotes the polymerization reaction of the maleimide resin.

Examples of the imidazole compound having a triazine skeleton of the exemplary embodiment include a compound represented by a formula (A4') below (hereinafter simply referred to "component (A4')" in some cases).

[Formula 13]

(A4')

In the formula (A4'), $R^{41}$ and $R^{42}$ are each independently a hydrogen atom, an alkyl group having 1 to 20 carbon atoms, a hydroxymethyl group, or a phenyl group, preferably a hydrogen atom or an alkyl group having 1 to 10 carbon atoms, and more preferably a hydrogen atom or an alkyl group having 1 to 3 carbon atoms. $R^{43}$ is a hydrogen atom, an alkyl group having 1 to 20 carbon atoms, a phenyl group, or an allyl group, preferably an alkyl group having 1 to 10 carbon atoms, and more preferably an alkyl group having 1 to 3 carbon atoms. $L^{41}$ is an alkylene group having 1 to 5 carbon atoms, preferably an alkylene group having 2 to 4 carbon atoms, and more preferably an ethylene group.

Specific examples of the component (A4') of the exemplary embodiment include 2,4-diamino-6-[2-(2-methyl-1-imidazolyl)ethyl]-1,3,5-triazine, 2,4-diamino-6-[2-(2-ethyl-4-methyl-1-imidazolyl)ethyl]-1,3,5-triazine, and 2,4-diamino-6-[2-(2-undecyl-1-imidazolyl)ethyl]-1,3,5-triazine. Among the above compounds, in view of the peel strength and reaction temperature of the resin sheet, 2,4-diamino-6-[2-(2-methyl-1-imidazolyl)ethyl]-1,3,5-triazine, or 2,4-diamino-6-[2-(2-ethyl-4-methyl imidazolyl)ethyl]-1,3,5-triazine is preferable.

In the exemplary embodiment, the content of the compound having the triazine skeleton (A4) in the resin composition is preferably 0.05 mass % or more, and more preferably 0.1 mass % or more with respect to a total solid content of the resin composition (i.e. when the total content of a non-volatile component of the resin composition except for a solvent is defined as 100 mass %). Further, the upper limit of the content of the compound having the triazine skeleton (A4) is preferably 3 mass % or less, and more preferably 2 mass % or less.

When the content of the compound having the triazine skeleton (A4) is within the above range, the peel strength of the resin sheet can be further enhanced and a reaction temperature can be further lowered.

One type of the compounds having a triazine skeleton (A4) is usable alone, or two or more types thereof are usable in combination in the resin composition of the exemplary embodiment.

Allyl Resin (A5)

The thermosetting component (A) contained in the resin composition of the exemplary embodiment preferably further contains an allyl resin (A5). The allyl resin (A5) (hereinafter simply referred to as "component (A5)" in some cases) is preferably liquid at normal temperature. The allyl resin contained in the thermosetting component (A) further facilitates improvement in the peel strength of the cured resin sheet of the exemplary embodiment while lowering a reaction temperature of the resin sheet. Further, the allyl resin (A5) appropriately adjusts a complex viscosity η of the resin sheet to provide fluidity of the resin sheet when the resin sheet is applied on an adherend, and further improves the heat resistance of the cured resin sheet.

In the exemplary embodiment, a mass ratio of the maleimide resin to the allyl resin (A5) (maleimide resin/component (A5)) is preferably 1.5 or more, and more preferably 3 or more. Further, the upper limit of the mass ratio (maleimide resin/component (A5)) may be, for instance, 50 or less, is preferably 25 or less, and more preferably 15 or less.

When the mass ratio (maleimide resin/component (A5)) is within the above range, the heat resistance of the resin sheet is improvable.

Further, the allyl resin is inhibited from bleeding out of the resin sheet when the mass ratio (maleimide resin/component (A5)) is within the above range.

The allyl resin (A5) of the exemplary embodiment is not particularly limited as long as the allyl resin (A5) has an allyl group. For instance, the allyl resin (A5) of the exemplary embodiment is preferably an allyl resin having two or more allyl groups in one molecule.

The allyl resin of the exemplary embodiment is more preferably represented by a formula (8), a formula (9) or a formula (10) below.

[Formula 14]

(8)

[Formula 15]

(9)

[Formula 16]

(10)

In the formula (8), $R^7$ and $R^8$ are each independently an alkyl group, preferably an alkyl group having 1 to 10 carbon atoms, more preferably an alkyl group having 1 to 4 carbon atoms, and further preferably an alkyl group selected from the group consisting of a methyl group and an ethyl group.

In the formula (9), n3 is in a range from 1 to 4, preferably in a range from 1 to 3, and more preferably in a range from 1 to 2. Further, in the allyl resin represented by the formula (9), a ratio of components whose n3 is 1 is preferably 90 mol % or more.

Specific examples of the allyl resin (A5) of the exemplary embodiment include diallyl bisphenol A (2,2-bis(3-allyl-4-hydroxyphenyl)propane), allylphenol resins represented by the formula (9), and allylphenol resins represented by the formula (10). One type of the allyl resins is usable alone, or two or more types thereof are usable in combination.

The thermosetting component (A) of the exemplary embodiment optionally contains a thermosetting resin other than the components (A1) to (A3), a hardening accelerator other than the component (A4'), and a curable resin other than the component (A5) as long as an object of the invention is not impaired.

The thermosetting resin other than the components (A1) to (A3) may be any thermosetting resin having high heat resistance, examples of which include epoxy resin, benzoxazine resin, cyanate resin, and melamine resin. One type of the thermosetting resins is usable alone, or two or more types thereof are usable in combination.

Examples of the hardening accelerator other than the component (A4') include peroxides, phosphonium salts, benzopinacole and derivatives thereof, and imidazole compounds having no triazine skeleton (e.g. 2-ethyl-4-methylimidazole). One type of the hardening accelerators is usable alone, or two or more types thereof are usable in combination.

Examples of the curable resin other than the component (A5) include resins (e.g. phenol resin and a resin having C=C double bond other than the component (A5)), amines, acid anhydrides, and formaldehyde. One type of the curable resins is usable alone, or two or more types thereof are usable in combination.

When a thermosetting resin other than the components (A1) to (A3), a hardening accelerator other than the component (A4), or a curable resin other than the component (A5) is used, the content of these components is preferably 10 mass % or less, and more preferably 5 mass % or less with respect to a total solid content of the component (A) (i.e. when the content of a non-volatile component of the component (A) except for a solvent is defined as 100 mass %).

In the exemplary embodiment, the content of the thermosetting component (A) in the resin composition is preferably 2 mass % or more, and more preferably 5 mass % or more with respect to a total solid content of the resin composition (i.e. when the total content of a non-volatile component of the resin composition except for a solvent is defined as 100 mass %). Further, the upper limit of the content of the thermosetting component (A) is preferably 40 mass % or less, and more preferably 30 mass % or less.

When the content of the thermosetting component (A) is within the above range, handleability, sheet-shape retainability, and heat resistance of the resin sheet are improvable.

When the component (A1) of the exemplary embodiment is used, the content of the thermosetting component (A) in the resin composition is preferably 2 mass % or more, more preferably 5 mass % or more, and further preferably 7 mass % or more with respect to a total solid content of the resin composition (i.e. when the total content of a non-volatile component of the resin composition except for a solvent is defined as 100 mass %). Further, the upper limit of the content of the thermosetting component (A) is preferably 27 mass % or less, more preferably 25 mass % or less, and further preferably 23 mass % or less.

When the content of the thermosetting component (A) is within the above range, handleability, sheet-shape retainability, and heat resistance of the resin sheet are improvable.

Binder Component (B)

In the exemplary embodiment, the resin composition optionally contains a binder component (B) (hereinafter simply referred to as "component (B)" in some cases) in addition to the component (A). The binder component (B), which is additionally contained in the resin composition of the exemplary embodiment, provides film formability for the resin composition to be easily formed into a sheet shape. It should however be noted that, when the component (A1) serving also as a binder component is contained in the resin composition of the exemplary embodiment, the binder component may not be contained.

The binder component (B) of the exemplary embodiment is a resin component other than the component (A). The binder component (B) is an oligomer or a polymer having a repetition of units, whose functional group equivalent weight is preferably 5000 or more. When the binder component (B) includes a functional group, the binder component (B) may be involved in curing of the resin sheet by heat. In the invention, however, the binder component (B) is distinguished from the thermosetting component (A).

The binder component (B) can be selected from wide variety of compounds (e.g. irrespective of whether the binder component (B) is an aliphatic compound or an aromatic compound). The binder component (B) is preferably at least one resin selected from the group consisting of, for instance, a phenoxy resin, acrylic resin, methacrylic resin, polyester resin, urethane resin, and polyamide-imide resin, more preferably a phenoxy resin in view of heat resistance. It should be noted that the polyester resin is preferably a wholly aromatic polyester resin. One type of the binder components (B) is usable alone, or two or more types thereof are usable in combination.

The phenoxy resin is preferably a phenoxy resin having at least one skeleton selected from the group consisting of bisphenol A skeleton (hereinafter, bisphenol A may be referred to as "BisA"), bisphenol F skeleton (hereinafter, bisphenol F may be referred to as "BisF"), biphenyl skeleton, and naphthalene skeleton, and more preferably a phenoxy resin having a bisphenol A skeleton and bisphenol F skeleton.

In order to easily adjust the complex viscosity of the resin sheet within a desired range, the weight average molecular weight (Mw) of the binder component (B) is preferably in a range from 100 to 1,000,000, more preferably in a range from 1000 to 800,000, and further preferably in a range from 10,000 to 100,000. The weight average molecular weight herein refers to a value in terms of standard polystyrene measured by Gel Permeation Chromatography (GPC).

When the binder component (B) is used in the exemplary embodiment, the content of the binder component (B) in the resin composition is preferably 1 mass % or more, and more preferably 2 mass % or more with respect to a total solid content of the resin composition (i.e. when the total content of a non-volatile component of the resin composition except for a solvent is defined as 100 mass %). Further, the upper limit of the content of the binder component (B) is preferably 10 mass % or less, and more preferably 5 mass % or less.

When the content of the binder component (B) in the resin composition is within the above range, the complex viscosity of the resin sheet before being cured is easily adjustable to a desired range, thereby enhancing handleability and sheet-formability of the resin sheet.

Thermally Conductive Filler (C)

In the exemplary embodiment, the resin composition preferably contains a thermally conductive filler (C) (hereinafter simply referred to as "component (C)" in some cases) in addition to the component (A). The component (C) improves heat characteristics and/or mechanical characteristics of the resin sheet.

Examples of the thermally conductive filler (C) include boron nitride particles and alumina particles. Among the above, boron nitride particles (C1) (hereinafter simply referred to as "component (C1)" in some cases) and alumina particles (C2) (hereinafter simply referred to as "component (C2)" in some cases) are preferable to improve the thermal diffusion rate of the resin sheet.

One type of the thermally conductive fillers (C) is usable alone, or two or more types thereof are usable in combination. The thermally conductive filler (C) is optionally surface-treated.

An average particle size of the thermally conductive filler (C) is not particularly limited. The average particle size of the boron nitride particles (C1) is preferably 0.1 µm or more, more preferably 0.2 µm or more, and further preferably 0.3 µm or more in terms of the d50 value. The upper limit of the average particle size of the boron nitride particles (C1) is preferably 30 µm or less, more preferably 20 µm or less, and further preferably 15 µm or less.

The average particle size of the alumina particles (C2) is preferably 3 µm or more and more preferably 4 µm or more in terms of the d50 value. Further, the upper limit of the average particle size of the alumina particles (C2) is preferably 50 µm or less, more preferably 35 µm or less, and further preferably 20 µm or less.

The average particle size of the thermally conductive filler (C) herein is a value measured through dynamic light scattering.

The sum of the contents of the boron nitride particles (C1) and alumina particles (C2) in the resin composition is preferably 50 mass % or more, more preferably 65 mass % or more, further preferably 78.5 mass % or more, and especially preferably 80 mass % or more with respect to a total solid content of the resin composition (i.e. when the total content of a non-volatile component of the resin composition except for a solvent is defined as 100 mass %). When the sum of the contents of the components (C1) and (C2) in the resin composition is equal to or more than the above lower limit, the thermal diffusion rate of the resin sheet is improvable.

The upper limit of the sum of the contents is preferably 90 mass % or less, more preferably 88 mass % or less, further preferably 86 mass % or less, and especially preferably 85 mass % or less. When the sum of the contents of the components (C1) and (C2) in the resin composition is equal to or less than the above upper limit, the thermal diffusion rate of the resin sheet is improvable.

The resin composition may contain both the boron nitride particles (C1) and the alumina particles (C2). In that case, the mass ratio of the boron nitride particles (C1) to the alumina particles (C2) in the resin composition is preferably 0.1 or more and more preferably 0.2 or more assuming that the mass of the alumina particles (C2) is 1. When the mass ratio is equal to or more than the above lower limit, the thermal diffusion rate of the resin sheet is improvable.

Further, when the resin composition contains both the boron nitride particles (C1) and the alumina particles (C2), the upper limit of the mass ratio of the boron nitride particles (C1) to the alumina particles (C2) in the resin composition is preferably 0.75 or less, and more preferably 0.6 or less. When the mass ratio is equal to or less than the above upper limit, the peel strength of the resin sheet after being thermally cured is improvable.

The content of the thermally conductive filler (C) in the resin composition is preferably 50 mass % or more, more preferably 65 mass % or more, further preferably 78.5 mass % or more, and especially preferably 80 mass % or more with respect to a total solid content of the resin composition (i.e. when the total content of a non-volatile component of the resin composition except for a solvent is defined as 100 mass %). When the content of the thermally conductive filler (C) in the resin composition is equal to or more than the above lower limit, the thermal diffusion rate of the resin sheet is improvable.

The upper limit of the content of the thermally conductive filler (C) is preferably 90 mass % or less, more preferably 88 mass % or less, further preferably 86 mass % or less, and especially preferably 85 mass % or less. When the content of the thermally conductive filler (C) in the resin composition is equal to or less than the above upper limit, the peel strength of the resin sheet after being thermally cured is improvable.

Coupling Agent (D)

In the exemplary embodiment, the resin composition preferably further contains a coupling agent (D) in addition to the components (A) and (C).

The coupling agent preferably includes a group reactive with a functional group of the above-described thermosetting component (A), and more preferably includes a group reactive with a functional group of the above-described thermosetting component (A).

The use of the coupling agent (D) improves peel strength between a cured product of the resin sheet and an adherend.

The coupling agent (D) is preferably a silane coupling agent in order to achieve effects of the invention. One type of the coupling agents (D) is usable alone, or two or more types thereof are usable in combination. The content of the above-described coupling agent is typically 0.1 parts by mass or more, and preferably 0.3 parts by mass or more with respect to 100 parts by mass of the thermosetting component (A). The upper limit of the content of the coupling agent is typically 7 parts by mass or less, preferably 5 parts by mass or less, and more preferably 3 parts by mass or less.

The resin composition of the exemplary embodiment is exemplified by a resin composition that consists of the thermosetting component (A), the thermally conductive filler (C), and the coupling agent (D).

Further, the resin composition of the exemplary embodiment is exemplified by a resin composition that contains the thermosetting component (A), the thermally conductive filler (C), the coupling agent (D), and any other component(s) than the components (A), (C), and (D).

Other Components

The resin composition of the exemplary embodiment optionally further contains other components. Examples of the other components include at least one component selected from the group consisting of a cross-linker, pigment, dye, antifoaming agent, leveling agent, ultraviolet absorber, foaming agent, antioxidant, flame retardant, dispersant, antisettling agent, thickener and ion scavenger.

For instance, the resin composition optionally further contains a cross-linker in order to adjust primary adhesiveness and cohesive properties before being cured.

Examples of the cross-linker include an organic polyvalent isocyanate compound and an organic polyvalent imine compound. One type of the cross-linkers is usable alone, or two or more types thereof are usable in combination.

Examples of the organic polyvalent isocyanate compound include an aromatic polyvalent isocyanate compound, aliphatic polyvalent isocyanate compound, alicyclic polyvalent isocyanate compound, trimer of these polyvalent isocyanate compounds, and isocyanate-terminated urethane prepolymer obtained through a reaction of one or more of these polyvalent isocyanate compounds and a polyol compound.

Further specific examples of the organic polyvalent isocyanate compound include 2,4-tolylene diisocyanate, 2,6-tolylene diisocyanate, 1,3-xylylene diisocyanate, 1,4-xylylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicycylohexylmethane-4,4'-diisocyanate, dicycylohexylmethane-2,4'-diisocyanate, and lysine isocyanate. One type of the organic polyvalent isocyanate compounds is usable alone, or two or more types thereof are usable in combination.

Specific examples of the organic polyvalent imine compound include N,N'-diphenylmethane-4,4'-bis(1-aziridine carboxyamide), trimethylolpropane-tri-β-aziridinylpropionate, tetramethylolmethane-tri-β-aziridinylpropionate, and N,N'-toluene-2,4-bis(1-aziridine carboxyamide)triethylenemelamine. One type of the organic polyvalent imine compounds is usable alone, or two or more types thereof are usable in combination.

The content of the above-described cross-linker is typically 0.01 parts by mass or more, and preferably 0.1 parts by mass or more with respect to 100 parts by mass of the above-described resin components. The upper limit of the content of the cross-linker is typically 12 parts by mass or less, and preferably 10 parts by mass or less.

Resin Sheet

The resin sheet of the exemplary embodiment is made using the above-described resin composition of the exemplary embodiment.

The resin sheet preferably consists of the resin composition according to the exemplary embodiment in view of sealability for a semiconductor device, conformability to surface irregularities of an adherend when the resin sheet is interposed between the semiconductor device and other electronic components, and the like. In other words, the resin sheet is preferably not a composite material produced, for instance, by combining the resin composition and a fiber sheet (e.g. a prepreg).

The resin sheet of the exemplary embodiment needs as follows: when a cross section (P) of the resin sheet (taken by cutting the resin sheet in a vertical direction to a surface of the resin sheet) is observed in an area (P1), a condition represented by a numerical formula (F1) below is satisfied, the area (P1) being defined by a square whose sides are four times as large as the thickness of the resin sheet, the area (P1) including two surfaces of the resin sheet.

$$0.25 \leq Ld/Lt \leq 1 \tag{F1}$$

Figure 1:
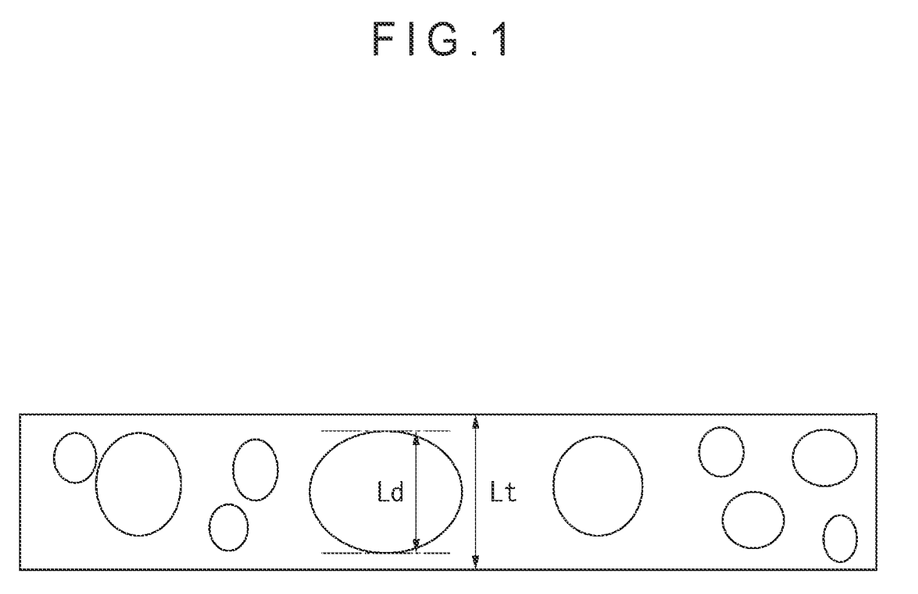
FIG. 1 is a schematic cross-sectional view of a resin sheet according to an exemplary embodiment.

Ld: a vertical length of a filler particle having a largest cross-sectional diameter in the vertical direction of the thermally conductive filler (C) (see FIG. 1)

Lt: a vertical length of the resin sheet (see FIG. 1)

When the value Ld/Lt is less than 0.25, the thermal conductivity is lowered. In contrast, when the value Ld/Lt exceeds 1, irregularities are caused on a surface of the resin sheet to adversely affect the adhesiveness. For the same point of view, the value Ld/Lt is preferably 0.29 or more, and more preferably 0.33 or more. The upper limit of the value Ld/Lt is preferably 0.99 or less, and more preferably 0.95 or less.

The thermal diffusion rate of the thermally cured resin sheet of the exemplary embodiment is required to be $1.0 \times 10^{-6}$ m$^2$/s or more, preferably $1.1 \times 10^{-6}$ m$^2$/s or more, more preferably $1.2 \times 10^{-6}$ m$^2$/s or more, further preferably $1.3 \times 10^{-6}$ m$^2$/s or more, still further preferably $1.35 \times 10^{-6}$ m$^2$/s or more, and especially preferably $1.5 \times 10^{-6}$ m$^2$/s or more. Further, the upper limit of the thermal diffusion rate of the thermally cured resin sheet is preferably $1 \times 10^{-5}$ m$^2$/s or less, more preferably $8 \times 10^{-6}$ m$^2$/s or less, further preferably $5 \times 10^{-6}$ m$^2$/s or less, still further preferably $4 \times 10^{-6}$ m$^2$/s or less, and especially preferably $3 \times 10^{-6}$ m$^2$/s or less.

When the thermal diffusion rate of the thermally cured resin sheet is within the above range, a highly thermally-conductive cured product can be obtained. The thermal diffusion rate of the thermally cured resin sheet is a characteristic value measured by a method described in later-described Examples.

The peel strength of the thermally cured resin sheet according to the exemplary embodiment is preferably 1.0 N/10 mm or more, more preferably 2.0 N/10 mm or more, further preferably 3.0 N/10 mm or more, and especially preferably 4.0 N/10 mm or more. The upper limit of the peel strength of the thermally cured resin sheet is more preferably 50 N/10 mm or less, and further preferably 40 N/10 mm or less.

When the peel strength of the thermally cured resin sheet of the exemplary embodiment is 1.0 N/10 mm or more, high adhesiveness to an adherend can be maintained with the resin sheet used as a sealing material.

The peel strength of the thermally cured resin sheet of the exemplary embodiment can fall within the above range by, for instance, adjusting the type (especially the type of the hardening accelerator) and content of the components used for the resin composition.

The peel strength of the thermally cured resin sheet of the exemplary embodiment was determined by a measurement method described below, where a peeling test was performed between a thermally cured resin sheet and an adherend at a peel angle of 90 degrees. Specifically, a test piece was prepared and subjected to the peeling test as in Examples.

In the resin sheet of the exemplary embodiment, the resin composition is a sheet-shaped, which makes the application to an adherend easy, especially to an adherend of a large area.

The sheet-shaped resin composition is formed in a shape in conformity with the shape after a sealing step, which can thus be provided as a sealing material with a certain uniformity only by the application of the sheet-shaped resin composition. Further, the sheet-shaped resin composition is excellent in handleability.

A method for shaping the resin composition into a sheet may be any conventionally known sheet-shaping method without being particularly limited. The resin sheet is preferably in a form of a coating film of the resin composition to easily provide a thin resin sheet. The resin sheet in the form of the coating film of the resin composition can be produced by a manufacturing method including a step for applying the resin composition.

The method for applying the resin composition may be any known method without being particularly limited. The resin composition may be dried as needed after being applied. The conditions for drying is not particularly limited as long as the resin composition is not cured. The resin sheet of the exemplary embodiment may be band-shaped and provided in a form of a roll of the wound sheet. The resin sheet of the exemplary embodiment provided in the form of the wound roll is usable, for instance, by unwinding and cutting the sheet into a desired size.

The thickness of the resin sheet of the exemplary embodiment is, for instance, preferably 10 μm or more, more preferably 20 μm or more, and further preferably 30 μm or more. Further, the thickness of the resin sheet of the exemplary embodiment is preferably 200 μm or less, more preferably 150 μm or less, and further preferably 120 μm or less. When the resin sheet is in a form of a coating film of the resin composition, the resin sheet is easily thinned. The thickness of the resin sheet according to the exemplary embodiment is preferably 100 μm or less, more preferably 80 μm or less, further preferably 50 μm or less.

Thermosetting Conditions

In thermosetting conditions for the resin sheet according to the exemplary embodiment, the heating temperature is preferably 50 degrees C. or more, more preferably 100 degrees C. or more, further preferably 130 degrees C. or more, and still further preferably 160 degrees C. or more. Further, the upper limit of the heating temperature is preferably 300 degrees C. or less, more preferably 250 degrees C. or less, further preferably 230 degrees C. or less, and still further preferably 210 degrees C. or less.

In the thermosetting conditions for the resin sheet of the exemplary embodiment, the heating time is preferably 10 minutes or more, and more preferably 20 minutes or more. Further, the upper limit of the heating time is preferably 10 hours or less, and more preferably 7 hours or less.

When the thermosetting conditions for the resin sheet are within the above ranges, the resin sheet can be thermally cured at a low temperature and in a short time.

Laminate

Figure 2:
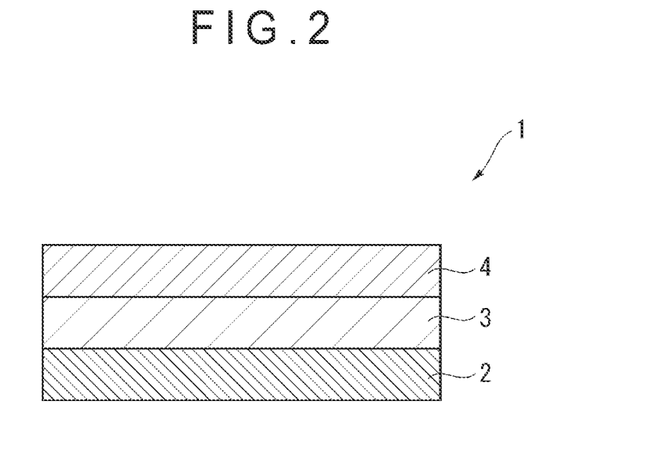
FIG. 2 is a schematic cross-sectional view of a laminate according to the exemplary embodiment.

FIG. 2 is a schematic cross-sectional view of a laminate 1 according to the exemplary embodiment.

The laminate 1 of the exemplary embodiment includes a first release member 2, a second release member 4, and a resin sheet 3 interposed between the first release member 2 and the second release member 4. The resin sheet 3 is the resin sheet according to the exemplary embodiment.

The first release member 2 and the second release member 4 have releasability. The first release member 2 is preferably different in release force with respect to the resin sheet 3 from the second release member 4. Materials of the first release member 2 and the second release member 4 are not particularly limited. A ratio (P2/P1) of a release force P1 of the first release member 2 to a release force P2 of the second release member 4 is preferably 0.02≤P2/P1<1 or 1<P2/P1≤50.

The first release member 2 and the second release member 4 may be, for instance, members made from inherently releasable materials. Alternatively, the first release member 2 and the second release member 4 may be members having been subjected to a release treatment, members laminated with a release agent layer, or the like. When the first release member 2 and the second release member 4 are not subjected to the release treatment, examples of the material for the first release member 2 and the second release member 4 include, for instance, olefin resin and fluorine resin.

The first release member 2 and the second release member 4 may be release members each provided with a release base material and a release agent layer that is formed by coating the release base material with a release agent. The release member provided with the release base material and the release agent layer is easily handleable. The first release member 2 and the second release member 4 may include the release agent layer only on one side of the release base material or the release agent layers on both sides of the release base material.

Examples of the release base material include a paper base material, a laminated paper provided by laminating a thermoplastic resin (e.g. polyethylene) on the paper base material, and a plastic film. Examples of the paper base material include glassine paper, coated paper, and cast coated paper. Examples of the plastic film include a polyester film (e.g. polyethylene terephthalate, polybutylene terephthalate, and polyethylene naphthalate) and a polyolefin film (e.g. polypropylene and polyethylene). Among the above, the polyester film is preferable.

Examples of the release agent include a variety of release agents, as follows: a silicone release agent that contains silicone resin; a long-chain-alkyl-group-containing compound release agent that contains a compound having a long-chain alkyl group such as polyvinyl carbamate and alkyl urea derivatives; an alkyd resin release agent that contains alkyd resin (e.g. non-convertible alkyd resin and convertible alkyd resin); an olefin resin release agent that contains olefin resin (e.g. polyethylene (such as high-density polyethylene, low-density polyethylene, and linear low-density polyethylene), and crystalline polypropylene resin such as propylene homopolymer having isotactic or syndiotactic structure and propylene-α-olefin copolymer); a rubber release agent that contains rubber such as natural rubber and synthetic rubber (e.g. butadiene rubber, isoprene rubber, styrene-butadiene rubber, methyl methacrylate-butadiene rubber, and acrylonitrile-butadiene rubber); and an acrylic resin release agent that contains acrylic resin such as (meth)acrylic ester copolymer. One type of the release agents is usable alone, or two or more types thereof are usable in combination. Among the above, the alkyd resin release agent is preferable. Especially, when a phenoxy resin is used as the binder component (B) of the resin composition contained in the resin sheet 3, a general-purpose silicone release agent may cause unexpected peeling of the release member before the resin sheet 3 is used. Accordingly, the alkyd resin release agent is preferably used.

The thickness of each of the first release member 2 and the second release member 4 is not particularly limited. The thickness is typically in a range from 1 μm to 500 μm, and preferably in a range from 3 μm to 100 μm.

The thickness of the release agent layer is not particularly limited. When the release agent layer is formed by applying a solution containing a release agent, the thickness of the release agent layer is preferably in a range from 0.01 μm to 3 μm, and more preferably in a range from 0.03 μm to 1 μm.

A manufacturing method of the laminate 1 is not particularly limited. An exemplary method for manufacturing the laminate 1 includes steps as described below. Initially, the resin composition is applied on the first release member 2 to form a coating film. Subsequently, the coating film is dried to form the resin sheet 3. Next, the resin sheet 3 and the second release member 4 are joined at a normal temperature to produce the laminate 1. The ratio (P2/P1) of the release force P2 of the second release member 4 to the release force P1 of the first release member 2 is likely to be P2/P1<1 when the first release member 2 and the second release member 4 are of the same type. The first release member 2 and the second release member 4 may be of different types. In this case, the value of P2/P1 tends to be small by applying the resin composition on the first release member 2.

Effect(s) of Exemplary Embodiment

The resin sheet and the laminate of the exemplary embodiment can provide improved thermal conductivity and adhesiveness after being thermally cured for the resin sheet with excellent heat resistance.

As described above, the resin sheet of the exemplary embodiment is suitably usable for a power semiconductor device. In other words, in semiconductor equipment of the exemplary embodiment, the semiconductor device is preferably a power semiconductor device. The power semiconductor device is expected to be operated at a high temperature of 200 degrees C. or more. The material used for semiconductor equipment provided with a power semiconductor device needs heat resistance. The resin sheet of the exemplary embodiment, which is excellent in heat resistance, is suitably used for covering a power semiconductor device in the semiconductor equipment or used by being interposed between the power semiconductor device and other components. The resin sheet of the exemplary embodiment is preferably applied over a plurality of semiconductor devices. For instance, the sheet-shaped resin composition (i.e. the resin sheet) is usable for a so-called panel level package, where the resin sheet is applied on a structure in which each semiconductor device is placed in a space formed in a frame, thereby collectively sealing the frame and the semiconductor devices.

The sealing for the semiconductor device may be a cover for protecting a back side of a flip-chip device. Typical protection sheets block the heat generated by the device, so that the heat is accumulated in the device. In contrast, using the resin sheet according to the exemplary embodiment as a backside protection sheet of a flip-chip device can efficiently diffuse the heat generated by the device.

Further, the resin sheet according to the exemplary embodiment is excellent in thermal conductivity after the resin sheet is thermally cured. The heat generated by the power semiconductor device can thus be efficiently transferred to a heat sink and the like. Specifically, the resin sheet of the exemplary embodiment, which is excellent in heat resistance and thermal conductivity, is usable for sealing a power semiconductor device expected to be operated at a high temperature (i.e. 200 degrees C. or more), is usable by being interposed between a power semiconductor device and other electronic components, and is excellent in transferring the heat generated by the power semiconductor device to a heat sink and the like.

As described above, the resin sheet of the exemplary embodiment is suitably usable for a semiconductor device using a compound semiconductor. In other words, in semiconductor equipment of the exemplary embodiment, the semiconductor device is preferably a semiconductor device using a compound semiconductor. The semiconductor device using the compound semiconductor, which is different in properties from the silicon semiconductor device, is suitably used for applications such as a power semiconductor device, a high-power device for a base station, a sensor, a detector, and a Schottky barrier diode. In such applications, the heat resistance of the semiconductor device using the compound semiconductor also receives attention. The resin sheet of the exemplary embodiment excellent in heat resistance is thus suitably used in combination with the semiconductor device using the compound semiconductor. Further, the resin sheet according to the exemplary embodiment, which is excellent in thermal conductivity after the resin sheet is thermally cured, can efficiently transfer the heat generated by the semiconductor device using the compound semiconductor to a heat sink and the like.

Furthermore, the resin sheet of the exemplary embodiment is preferably used for sealing a semiconductor device using a compound semiconductor. Alternatively, the resin sheet of the exemplary embodiment is preferably interposed between a semiconductor device using a compound semiconductor and other electronic components. Examples of other electronic components include a printed-wiring board and a lead frame.

The upper limit of the operable temperature of a silicon semiconductor device is approximately 175 degrees C. Accordingly, the power semiconductor device is preferably a semiconductor device using a compound semiconductor capable of high-temperature operation. Examples of the compound semiconductor include silicon carbide, gallium nitride, aluminum gallium nitride, gallium oxide, and gallium arsenide, among which at least one of silicon carbide, gallium nitride, aluminum gallium nitride, or gallium oxide is preferable.

The resin sheet of the exemplary embodiment, which is excellent in heat resistance and thermal conductivity, is usable for sealing a semiconductor device using a compound semiconductor expected to be operated at a high temperature (i.e. 200 degrees C. or more), is usable by being interposed between a semiconductor device using a compound semiconductor and other electronic components, and is excellent in transferring the heat generated by the semiconductor devices to a heat sink and the like.

Modifications of Exemplary Embodiment

The invention is not limited to the above-described exemplary embodiment but includes modifications and improvements as long as an object of the invention is achievable.

In the above exemplary embodiment, the laminate including the first release member, the second release member, and the resin sheet provided between the first release member and the second release member has been explained. The invention is not limited thereto, and a laminate in which a release member is provided only on one side of the resin sheet is applicable.

In the above exemplary embodiment, explanation has been made about the resin sheet of the invention used for sealing the semiconductor in the semiconductor equipment. The invention, however, is not limited thereto. The resin sheet of the invention is usable as an insulating material for a circuit board (e.g. a hard printed wiring board material, a flexible wiring board material, and a build-up board interlayer insulating material), a build-up adhesive film, an adhesive, and the like.

EXAMPLES

The invention will be described in further detail with reference to Examples. It should be noted that the scope of the invention is by no means limited to Examples.

Examples and Comparative

Preparation of Resin Composition

Resin compositions according to Examples 1 to 4 were prepared in accordance with blending proportions (mass %, proportion in terms of the solid content) shown in Table 1.

The materials used for preparing the resin composition were as follows.

Thermosetting Component
  First maleimide resin: a long-chain alkyl maleimide resin (solid at a temperature of 25 degrees C., the maleimide resin represented by the formula (A1-1-1), "SLK-3000" manufactured by Shin-Etsu Chemical Co., Ltd.)
  Second maleimide resin: a maleimide resin having a biphenyl group (the maleimide resin represented by the formula (3), "MIR-3000" manufactured by Nippon Kayaku Co., Ltd.)
  Third maleimide resin: a long-chain alkyl maleimide resin (liquid at a temperature of 25 degrees C., the maleimide resin represented by the formula (7-1-1), "SLK-1500" manufactured by Shin-Etsu Chemical Co., Ltd.)
  Allyl resin: diallyl bisphenol A ("DABPA" manufactured by Daiwa Kasei Industry Co., Ltd.)
  Compound having triazine skeleton: 2,4-diamino-6-[2-(2-ethyl-4-methyl-1-imidazolyl)ethyl]-1,3,5-triazine ("2E4MZ-A" manufactured by SHIKOKU CHEMICALS CORPORATION) 5 [0122]

Coupling Agent

Coupling agent: 3-glycidoxypropyl triethoxysilane

Thermally Conductive Fillers

Alumina particles-1: ("CB-A50S" manufactured by Showa Denko K.K., average particle size (d50): 50 μm)

Alumina particles-2: ("CB-A30S" manufactured by Showa Denko K.K., average particle size (d50): 30 μm)

Alumina particles-3: ("CB-P05" manufactured by Showa Denko K.K., average particle size (d50): 4 μm)

Boron nitride particles-1: ("UHP-2" manufactured by Showa Denko K.K., average particle size (d50): 11 μm)

Boron nitride particles-2: ("UHP-S2" manufactured by Showa Denko K.K., average particle size (d50): 0.7 μm)

Evaluation of Resin Sheet Before being Thermally Cured

Preparation of Laminate Including Resin Sheet

Resin varnish (coating solution prepared by dissolving the resin composition in cyclohexanone, whose solid content concentration was 72 mass %) was applied on the first release member (polyethylene terephthalate film provided with a release layer made using an alkyd resin release agent, a thickness of 38 μm) using a knife coater, and was dried for one minute at 90 degrees C. and for one minute at 115 degrees C. The thickness of the dried resin composition was as shown in Table 1. Immediately after the first release member coated with the resin composition was taken out of a drying furnace, the dried resin composition and the second release member (polyethylene terephthalate film provided with a release layer made using a silicone release agent, a thickness of 38 μm) were stacked on top of each other at normal temperature to prepare a laminate with the first release member, the resin sheet made using the resin composition, and the second release member being laminated in this order.

Evaluation of Thermally Cured Resin Sheet

Preparation of Laminate Including Resin Sheet

A laminate was produced in the same manner as in the above evaluation of resin composition before being thermally cured.

Thickness of Resin Sheet

The thickness of the resin sheet was measured using a constant-pressure thickness gauge (model number "PG-02J" in compliance with standards JIS K6783, Z1702, Z1709) manufactured by TECLOCK Co., Ltd.

Observation of Cross Section of Resin Sheet

Figure 3:
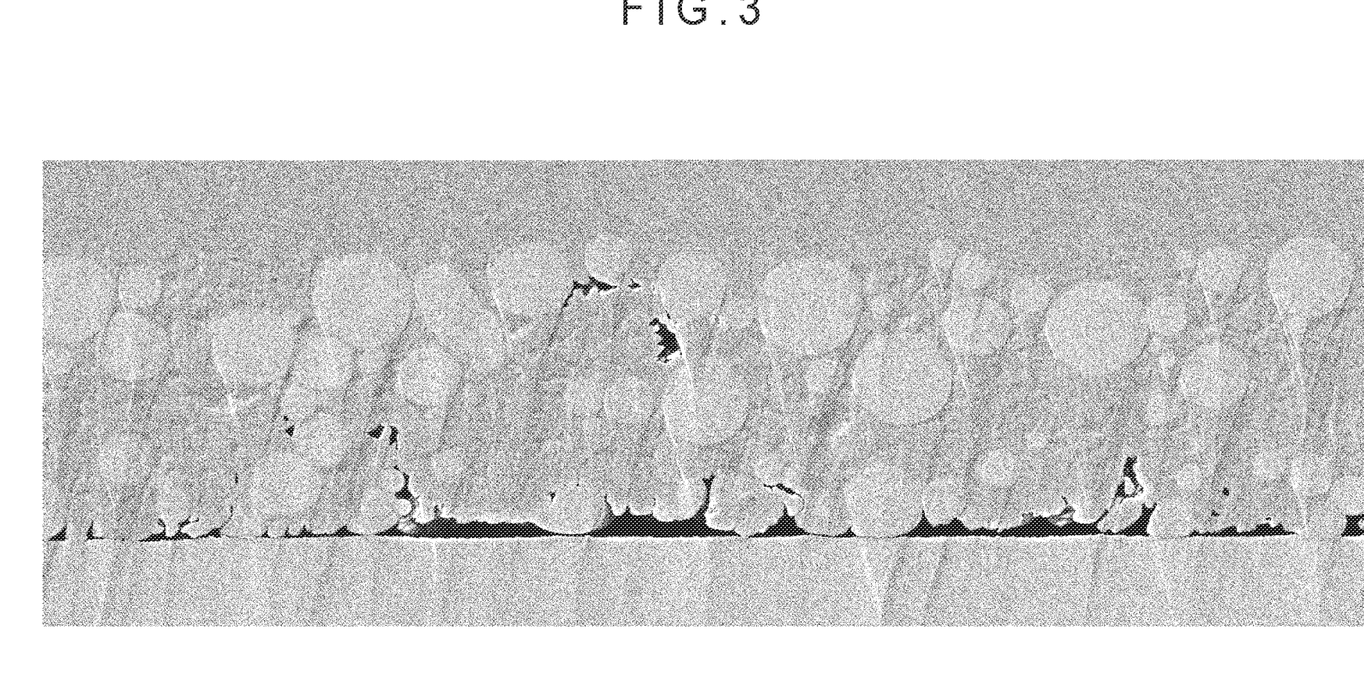
FIG. 3 is a photograph taken by a scanning electron microscope (SEM) and showing a cross section of a resin sheet produced in Example 4.

A glass plate and one side of the resin sheet of the prepared laminate were joined by vacuum bonding at a laminate temperature of 130 degrees C. (laminator: "V-130" manufactured by Nikko-Materials Co., Ltd., conditions: ultimate pressure 100 Pa; pressurization force 0.3 MPa; time 30 seconds). After the resin sheet was cured under predetermined thermosetting conditions (at a temperature of 200 degrees C. for four hours), a glass plate and the other side of the resin sheet were joined using a two-component curable epoxy resin adhesive (product name "Quick 5" manufactured by Konishi Co., Ltd.). The second release member and the first release member of the resin sheet of the laminate were released before the resin sheet was joined to the glass plates. A sample piece was thus prepared. The sample piece was cut in a direction orthogonal to the surface of the resin sheet. Then, a cross section (P) of the sample piece was observed in an area (P1), which was surrounded by a square whose sides were four times as large as the thickness of the resin sheet, the area (P1) including two surfaces of the resin sheet. Then, values of Ld and Lt as described below were measured to calculate a value of Ld/Lt. The results are shown in Table 1. Further, an SEM photograph showing the cross section of the resin sheet taken in Example 4 is shown in FIG. 3.

Ld: a vertical length of a filler particle having a largest cross-sectional diameter in the vertical direction of the thermally conductive filler (C)

Lt: a vertical length of the resin sheet

Measurement of Thermal Diffusion Rate of Thermally Cured Resin Sheet

A plurality of the resin sheets were joined to prepare a 200-μm thick piece, which was cured under predetermined thermosetting conditions (at a temperature of 200 degrees C. for four hours) to prepare a sample. The first and second release members of the laminate were removed as appropriate in the process of joining the resin sheets. The thermal diffusion rate of the sample was measured through temperature wave analysis using a thermal diffusion rate measuring machine ("ai-Phase Mobile 1" manufactured by ai-Phase Co., Ltd).

The results are shown in Table 1.

Measurement of Peel Strength

A copper plate (as specified by JIS-C1220P, 400 μm-thick) and one side of the resin sheet of the resultant laminate were joined through vacuum bonding at a laminate temperature of 130 degrees C. (laminator: "V-130" manufactured by Nikko-Materials Co., Ltd., conditions: ultimate pressure 100 Pa; pressurization force 0.3 MPa; time 30 seconds). Subsequently, a copper foil (size 50 mm×10 mm, thickness 150 μm, as specified by JIS H 3100) and the other side of the resin sheet were joined through vacuum bonding under the same conditions as the above. The second release member and the first release member of the resin sheet of the laminate were released before the resin sheet was joined to the Si wafer and copper plate, respectively. Subsequently, the resin sheet was cured under predetermined thermosetting conditions (at a temperature of 200 degrees C. for four hours) to prepare a sample. Using a tensile tester ("Autograph AG-1S" manufactured by Shimadzu Corporation), the copper foil was peeled off from the cured resin sheet of the sample at a peeling rate of 50 mm/min and a peel angle of 90 degrees to measure the peel strength (unit: N/10 mm) between the copper foil and the cured resin sheet. The measurement was performed at a temperature of 25 degrees C. and relative humidity of 50%. The results are shown in Table 1.

TABLE 1

| | Composition (mass %) | | | | | | | | |
|---|---|---|---|---|---|---|---|---|---|
| | Thermosetting Component | | | | | Silane Coupling Agent | Inorganic Filler | | |
| | First | Second | Third | | | Silane | | | |
| | Maleimide Resin | Maleimide Resin | Maleimide Resin | Allyl Resin | Hardening Accelerator | Coupling Agent | Alumina Particles-1 | Alumina Particles-2 | Alumina Particles-3 |
| Ex. 1 | 7.00 | 4.17 | 4.17 | 1.59 | 0.25 | 0.30 | 60.02 | — | — |
| Ex. 2 | 7.00 | 4.17 | 4.17 | 1.59 | 0.25 | 0.30 | — | 60.02 | — |
| Ex. 3 | 7.00 | 5.20 | 5.20 | 1.99 | 0.31 | 0.30 | — | — | 60.00 |
| Ex. 4 | 7.00 | 5.20 | 5.20 | 1.99 | 0.31 | 0.30 | — | — | 60.00 |

| | Composition (mass %) | | | Evaluation Results | | | | | |
|---|---|---|---|---|---|---|---|---|---|
| | Inorganic Filler | | | | | | | | |
| | Boron Nitride Particles-1 | Boron Nitride Particles-2 | Total | Thickness (μm) | Ld (μm) | Lt (μm) | Ld/Lt | Thermal Diffusion Rate (m²/s) | Peel-Strength N/10 mm |
| Ex. 1 | 15.00 | 7.50 | 100.00 | 99 | 69.9 | 94.2 | 0.74 | $2.2 \times 10^{-6}$ | 6.5 |
| Ex. 2 | 15.00 | 7.50 | 100.00 | 50 | 21.6 | 48.5 | 0.45 | $2.3 \times 10^{-6}$ | 6.0 |
| Ex. 3 | — | 20.00 | 100.00 | 29 | 7.5 | 29.3 | 0.26 | $1.2 \times 10^{-6}$ | 10.3 |
| Ex. 4 | — | 20.00 | 100.00 | 15 | 5.2 | 14.9 | 0.35 | $1.2 \times 10^{-6}$ | 1.7 |

As is clear from the results shown in Table 1, the resin sheets obtained in Examples 1 to 4 each have a value Ld/Lt in a range from 0.25 to 1 and exhibit high peel strength and high thermal diffusion rate after the resin sheet is thermally cured.

The invention claimed is:

1. A resin sheet made using a resin composition comprising a thermosetting component (A) and a thermally conductive filler (C), wherein
the thermosetting component (A) comprises a first maleimide resin (A1), a second maleimide resin (A2), and a third maleimide resin (A3),
the first maleimide resin (A1) is a maleimide resin that is solid at a temperature of 25 degrees C. and has two or more maleimide groups in one molecule, at least a pair of the maleimide groups being bonded by a bonding group whose main chain comprises four or more methylene groups,
the second maleimide resin (A2) is represented by a formula (1) below or a formula (4) below,
the third maleimide resin (A3) is a maleimide resin that is liquid at a temperature of 25 degrees C. and has two or more maleimide groups in one molecule, at least a pair of the maleimide groups being bonded by a bonding group whose main chain comprises four or more methylene groups,
the first maleimide resin (A1) is represented by a formula (A1) below,
the third maleimide resin (A3) is represented by a formula (7) below,
a thermal diffusion rate of the resin sheet after being thermally cured is $1.0 \times 10^{-6}$ m²/s or more, and
when a cross section (P) of the resin sheet taken by cutting the resin sheet in a vertical direction to a surface of the resin sheet is observed in an area (P1), a condition represented by a numerical formula (F1) below is satisfied, the area (P1) being defined by a square whose sides are four times as large as a thickness of the resin sheet, the area (P1) including two surfaces of the resin sheet, $$0.25 \leq Ld/Lt \leq 1 \qquad (F1)$$

where Ld is a vertical length of a filler particle having a largest cross-sectional diameter in the vertical direction of the thermally conductive filler (C), and Lt is a length of the resin sheet in the vertical direction, (A1)

where, in the formula (A1):
$n_{11}$ is an integer of 0 or more, and an average of $n_{11}$ is in a range from 0.5 to 5,
$L^{11}$ and $L^{12}$ are each independently a substituted or unsubstituted alkylene group having 4 or more carbon atoms, in the alkylene group, at least one of —CH$_2$— is optionally replaced with —CH$_2$—O—, when a hydrogen atom of the alkylene group is replaced with a substituent, the substituent is an alkyl group having 1 to 14 carbon atoms or an alkoxy group having 1 to 14 carbon atoms, and the substituents are optionally bonded with each other to form an alicyclic or heterocyclic structure, and
$X^{11}$ is each independently a group not having a substituted or unsubstituted alkylene group having 4 or more carbon atoms,

(1)

where, in the formula (1):
k is an integer of 1 or more, and an average of k is in a range from 1 to 10,
m1 and m2 are each independently an integer of 1 or more and 2 or less, and a sum of m1 and m2 is 3 or less,
n1 and n2 are each independently an integer of 0 or more and 4 or less,
$R^1$ and $R^2$ are each independently an alkyl group having 1 to 6 carbon atoms, (4)

where, in the formula (4):
$R^3$ to $R^6$ are each independently a hydrogen atom or an alkyl group having 1 to 6 carbon atoms, $L^1$ is an alkylene group having 1 to 3 carbon atoms, $L^2$ and $L^3$ are each independently an alkylene group having 1 to 2 carbon atoms, or an arylene group having 6 to 10 carbon atoms, p and q are each independently 0 or 1, and a sum of the carbon atoms of $L^1$, $L^2$ and $L^3$ in a form of an alkylene group or alkylene groups is 3 or less, (7)

where, in the formula (7):
n is an integer of 0 or more, and an average of n is in a range from 0.5 to 5,
$L^4$ and $L^5$ are each independently a substituted or unsubstituted alkylene group having 4 or more carbon atoms, in the alkylene group, at least one of —$CH_2$— is optionally replaced with —$CH_2$—O—, when a hydrogen atom of the alkylene group is replaced with a substituent, the substituent is an alkyl group having 1 to 10 carbon atoms or an alkoxy group having 1 to 10 carbon atoms, and the substituents are optionally bonded to form an alicyclic structure, and
X is each independently a group not having a substituted or unsubstituted alkylene group having 4 or more carbon atoms.

2. The resin sheet according to claim 1, wherein the thermosetting component (A) further comprises a compound having a triazine skeleton (A4).

3. The resin sheet according to claim 2, wherein the compound having the triazine skeleton (A4) is an imidazole compound having a triazine skeleton.

4. The resin sheet according to claim 1, wherein the thermosetting component (A) further comprises an allyl resin (A5).

5. The resin sheet according to claim 1, wherein the resin composition further comprises boron nitride particles (C1).

6. The resin sheet according to claim 5, wherein the resin composition further comprises alumina particles (C2).

7. The resin sheet according to claim 6, wherein a sum of contents of the boron nitride particles (C1) and the alumina particles (C2) is 78.5 mass % or more with respect to a total solid content of the resin composition.

8. The resin sheet according to claim 1, wherein the resin sheet is used for sealing a semiconductor device, or used by being interposed between the semiconductor device and any other electronic component.

9. The resin sheet according to claim 1, wherein the resin sheet is used by being interposed between a heat sink and an electronic component.

10. The resin sheet according to claim 1, wherein the resin sheet is used for sealing a semiconductor device made using a compound semiconductor, or used by being interposed between the semiconductor device made using the compound semiconductor and any other electronic component.

11. The resin sheet according to claim 1, wherein the resin sheet is a coating film of the resin composition.

* * * * *